(12) United States Patent
Hirooka

(10) Patent No.: US 6,897,010 B2
(45) Date of Patent: *May 24, 2005

(54) METHOD OF RECORDING IDENTIFIER AND SET OF PHOTOMASKS

(75) Inventor: Taisuke Hirooka, Kobe (JP)

(73) Assignee: Neomax Co., Ltd., Osaka (JP)

( * ) Notice: Subject to any disclaimer, the term of this patent is extended or adjusted under 35 U.S.C. 154(b) by 127 days.

This patent is subject to a terminal disclaimer.

(21) Appl. No.: 10/229,038

(22) Filed: Aug. 28, 2002

(65) Prior Publication Data

US 2003/0059726 A1 Mar. 27, 2003

(30) Foreign Application Priority Data

Sep. 5, 2001 (JP) ........................................ 2001-269291

(51) Int. Cl.[7] .............................. G03F 7/30; H01L 21/30
(52) U.S. Cl. ....................... 430/323; 430/325; 430/326; 430/394; 438/401; 438/460; 438/462
(58) Field of Search ................................. 430/394, 323, 430/325, 326; 438/401, 460, 462

(56) References Cited

U.S. PATENT DOCUMENTS

| | | | | |
|---|---|---|---|---|
| 5,175,774 A | * | 12/1992 | Truax et al. ................ | 382/145 |
| 5,302,491 A | * | 4/1994 | Akylas et al. .............. | 430/311 |
| 5,837,963 A | | 11/1998 | Kitahara | |
| 6,312,876 B1 | * | 11/2001 | Huang et al. ............... | 430/323 |
| 6,449,123 B1 | | 9/2002 | Tsujimoto et al. | |
| 6,731,373 B2 | * | 5/2004 | Shoji ........................... | 355/53 |
| 2001/0048145 A1 | | 12/2001 | Takeuchi et al. | |
| 2002/0031732 A1 | | 3/2002 | Shoji | |
| 2003/0036025 A1 | * | 2/2003 | Hirooka ..................... | 430/394 |

FOREIGN PATENT DOCUMENTS

| | | |
|---|---|---|
| CA | 2 320 612 | 3/2002 |
| EP | 1 286 219 A2 | 2/2003 |
| JP | 62-146136 | 9/1987 |
| JP | 62-298422 | 12/1987 |
| JP | 04-102214 | 4/1992 |
| JP | 9-81922 | 3/1997 |
| JP | 10-134317 | 5/1998 |
| JP | 10-261559 | 9/1998 |
| JP | 11-126311 | 5/1999 |

OTHER PUBLICATIONS

U.S. Patent Application No. 10/211,568; Method for Recording Identifier and Set of Photomasks; filed on Aug. 5, 2002, Taisuke Hirooka.

* cited by examiner

*Primary Examiner*—John S. Chu
(74) *Attorney, Agent, or Firm*—Keating & Bennett, LLP

(57) ABSTRACT

A method of recording identifiers, each including a group of character strings A and B including $z_1$, and $z_2$ characters, respectively, on plate members involves the use of a photomask of a first type and at least one photomask of a second type. The photomask of the first type has an opaque pattern defining the character string A. The photomask of the second type has an opaque pattern defining at least one of the characters of the character string B. The method further includes the steps of forming a photoresist layer on one of the plate members, selectively exposing the photoresist layer to a radiation through the photomask of the first type to form a latent image of the character string A in the photoresist layer, and forming a latent image of the character of the character string B in the photoresist layer through the photomask of the second type.

26 Claims, 11 Drawing Sheets

| B1 B2 C1 C2 |

ALIGNMENT MARK

ALIGNMENT MARK

METHOD OF RECORDING IDENTIFIER AND SET OF PHOTOMASKS

BACKGROUND OF THE INVENTION

1. Field of the Invention

The present invention relates to a method of recording an identifier (i.e., an ID or an ID mark) on a plate member and a set of photomasks for use in such a method. Preferred embodiments of the present invention are effectively applicable for use to inscribe an identifier not only on a ceramic wafer for a magnetic head, for example, but also on a semiconductor wafer or any other plate-type member.

2. Description of the Related Art

Recently, a thin-film magnetic head having any of various structures often includes a magnetic head slider for use in a hard disk drive (HDD), a tape storage and a flexible (or floppy) disk drive (FDD), for example. Examples of wafers for such a thin-film magnetic head include sintered wafers having compositions such as $Al_2O_3$—TiC, SiC and $ZrO_2$.

FIG. 1A illustrates a typical thin-film magnetic head slider 10. On its tracking side, this magnetic head slider 10 includes two side rails 11 that will be opposed to the surface of a magnetic disk. The surface of the thin-film magnetic head slider 10 on which the side rails 11 are provided is sometimes called an "air bearing surface (ABS)". If the magnetic disk is rotated at a high velocity by a motor, for example, while the surface of the magnetic disk is pressed lightly by the side rails 11 of the magnetic head slider 10 by way of a head suspension, then an air layer will be formed on the surface of the magnetic disk and will reach the back surface of the air bearing surface of the slider 10. As a result, the magnetic head slider 10 is slightly lifted up. In this manner, the magnetic head slider 10 can perform read and write operations on the magnetic disk while "flying" near the surface of the disk so to speak.

A thin film 12, which causes a magnetic interaction with a storage medium such as the magnetic disk, is deposited on one end surface of the magnetic head slider 10. The thin film 12 is used to form part of an electrical/magnetic transducer. To indicate the type of the product, an identifier (ID or ID mark) 13 such as a serial number is inscribed on the other end surface of the magnetic head slider 10. Methods of inscribing an identifier 13 on sintered wafers are disclosed in Japanese Laid-Open Publications Nos. 9-81922, 10-134317 and 11-126311, for example.

In a typical manufacturing process, the magnetic head slider 10 is obtained by cutting out a bar 20 shown in FIG. 1B from a sintered 1 shown in FIG. 1C and then dicing the bar 20 into a great number of chips. In FIG. 1C, the end surface 4 of the wafer 1 is parallel to the air bearing surface of the magnetic head slider 10 shown in FIG. 1A.

Recently, as the sizes of such a thin-film magnetic head have been decreased to reduce the sizes and weight of an electronic appliance, the thickness of the wafer 1 (corresponding to the length L of the magnetic head slider 10) and the thickness T of each bar 20 (corresponding to the height of the magnetic head slider 10) have also been reduced. For example, a magnetic head slider, which is called a "pico-slider", has a length L of about 1.2 mm and a thickness T of about 0.3 mm. As for a magnetic head slider of such drastically reduced sizes, the sizes of characters to be inscribed on the slider should also be reduced correspondingly.

In the prior art, a laser marking method is often used to inscribe the identifier 13. In the laser marking method, the identifiers 13 shown in FIGS. 1A and 1B are written on the back surface 3 of the wafer 1 that is yet to be divided into the bars 20. After the ID marking printing process step is finished, various thin films 12 are stacked on the surface 2 of the wafer 1.

Hereinafter, the conventional laser marking method will be described briefly with reference to FIG. 2.

In the laser marking method, the back surface 3 of the wafer 1 is locally irradiated with a laser beam 6 that has been condensed by a lens 5, thereby rapidly heating and vaporizing the irradiated portion of the wafer 1. In this case, a tiny concave portion is formed on the back surface 3 of the wafer 1, while the material of the sintered wafer 1 is scattered around and just a portion of the scattered material is deposited on the wafer 1 again. By scanning the back surface 3 of the wafer 1 with the laser beam 6, the concave portions can be arranged so as to form an arbitrary pattern on the back surface 3 (which will be herein referred to as a "concave pattern"). Any of various types of identifiers 13 can be written at an arbitrary location on the wafer 1 by forming a concave pattern, which is made up of alphanumeric and/or numeric characters or a barcode, on the back surface 3 of the wafer 1.

A laser marking method as described above, however, has the following drawbacks.

Firstly, the portion of the sintered material that has been scattered around as a result of the exposure to the laser beam is likely adsorbed or deposited as dust onto the inscribed characters, thus causing a contamination problem in many cases.

Secondly, the edges of the inscribed characters are often burred through the exposure to the laser beam. Thus, a deburring processing step needs to be carried out.

A photolithographic method was used as an alternative identifier marking method that can avoid these problems. In the photolithographic process, first, the back surface 3 of the wafer 1 is coated with a photoresist layer. Next, the photoresist layer is exposed to a radiation through a particular photomask, thereby forming a latent image of the identifier in a desired region of the photoresist layer. Thereafter, the exposed photoresist layer is developed so as to transfer a pattern representing the identifier onto the photoresist layer. Finally, the wafer is selectively etched away by using the patterned photoresist layer as an etching mask. In this manner, the identifier can be written on the wafer. According to this photolithographic process, a fine-line pattern can be formed and any of various types of identifiers can be clearly recorded even within a narrow region.

The conventional photolithographic process described above is far from being cost effective for the following reasons. Specifically, when different types of identifiers should be written on multiple wafers, this photolithographic process requires the same number of photomasks as that of the wafers. However, photomasks are normally expensive. For example, just one photomask sometimes costs hundreds of thousand yen (i.e., over $1,000). For that reason, as the number of photomasks needed increases, the overall processing cost of this photolithographic process increases by leaps and bounds, thus constituting a great obstacle to desired cost reduction.

SUMMARY OF THE INVENTION

In order to overcome the problems described above, preferred embodiments of the present invention provide a method of recording various types of identifiers on a number of plate-type members by using a much smaller number of photomasks as compared to conventional methods.

Preferred embodiments of the present invention also provide a novel exposure process that is effectively applicable for use in the identifier recording method and further provide a set of photomasks for the exposure process.

A preferred embodiment of the present invention provides a method of recording mutually different identifiers on multiple plate members. Each of the identifiers preferably includes a group of character strings having character strings A and B. The character string A preferably includes a number $z_1$ of characters and the character string B preferably includes a number $z_2$ of characters, where $z_1$ and $z_2$ are both natural numbers. The method preferably includes the step of preparing a photomask of a first type and at least one photomask of a second type. The photomask of the first type preferably has an opaque pattern that defines the character string A, while the at least one photomask of the second type preferably has an opaque pattern that defines at least one of the characters of the character string B. The method preferably further includes the steps of forming a photoresist layer on the surface of one of the plate members, selectively exposing the photoresist layer to a radiation by using the photomask of the first type, thereby forming a latent image of the character string A in the photoresist layer, and forming a latent image of the at least one character of the character string B in the photoresist layer by using the at least one photomask of the second type.

In one preferred embodiment of the present invention, the character string B preferably includes at least two characters. The step of forming the latent image of the at least one character preferably includes the step of forming the latent image of one of the at least two characters of the character string B after another in the photoresist layer.

In another preferred embodiment of the present invention, the step of forming the latent image of the at least one character preferably includes the step of forming the latent image of one of the characters of the character string B after another in the photoresist layer by using a plurality of photomasks of the second type, which includes the at least one photomask of the second type, one by one. The photomasks of the second type preferably have opaque patterns that define mutually different types of characters.

In still another preferred embodiment, the step of forming the photoresist layer may include the step of forming the photoresist layer of a positive photoresist material on the surface of the plate member. In that case, the method preferably further includes the step of developing the photoresist layer of the positive photoresist material and removing portions of the photoresist layer, which correspond to the character strings, from the surface of the plate member.

Alternatively, the step of forming the photoresist layer may include the step of forming the photoresist layer of a negative photoresist material on the surface of the plate member. In that case, the method preferably further includes the step of developing the photoresist layer of the negative photoresist material and leaving portions of the photoresist layer, which correspond to the character strings, on the surface of the plate member.

Another preferred embodiment of the present invention provides a method of recording mutually different identifiers on multiple plate members. Each of the identifiers preferably includes a group of character strings having character strings A and B. The character string A preferably includes a number $z_1$ of characters and the character string B preferably includes a number $z_2$ of characters, where $z_1$ is an integer that is equal to or greater than zero and $z_2$ is a natural number. The method preferably includes the step of preparing multiple photomasks of a first type and multiple photomasks of a second type. Multiple openings, defining the character strings A, are preferably arranged periodically in X-axis and Y-axis directions in an opaque pattern of each of the photomasks of the first type. On the other hand, multiple openings, defining one of the characters of the character string B, are preferably arranged periodically in the X-axis and Y-axis directions in an opaque pattern of each of the photomasks of the second type. The method preferably further includes the steps of forming a photoresist layer on the surface of one of the plate members, selectively exposing the photoresist layer to a radiation by using one of the photomasks of the first type, thereby forming latent images of the character strings A in the photoresist layer, and forming latent images of one of the characters of the character string B after another in the photoresist layer by sequentially selecting a required one of the photomasks of the second type after another.

In one preferred embodiment of the present invention, the step of forming the latent images of the characters of the character string B preferably includes the step of aligning a first one of the photomasks of the second type with the photoresist layer so that a first selected character on the first photomask of the second type is projected onto a predetermined portion of the photoresist layer. The step of forming the latent images preferably further includes the step of performing a first exposure process to form a latent image of the first selected character in the predetermined portion of the photoresist layer after the step of aligning the first photomask of the second type has been performed. The step of forming the latent images preferably further includes the step of aligning the first one or a second one of the photomasks of the second type with the photoresist layer so that a second selected character on the first or second photomask of the second type is projected onto another predetermined portion of the photoresist layer. The step of forming the latent images preferably further includes the step of performing a second exposure process to form a latent image of the second selected character in the another predetermined portion of the photoresist layer after the step of aligning the first or second photomask of the second type has been performed.

In this particular preferred embodiment, the method preferably further includes the step of forming alignment marks before the step of forming the photoresist layer is performed. At least one of the step of aligning the first photomask of the second type and the step of aligning the first or second photomask of the second type is preferably carried out by using the alignment marks.

In another preferred embodiment of the present invention, the steps of forming the latent images preferably include the step of forming the latent images of the character strings over the entire surface of the photoresist layer by using a mask aligner.

In an alternative preferred embodiment, the steps of forming the latent images preferably include the step of forming the latent images of one of the character strings after another in multiple divided regions of the photoresist layer by using a stepper.

Still another preferred embodiment of the present invention provides a method of recording mutually different identifiers on multiple plate members. Each of the identifiers preferably includes a group of character strings having character strings A, B and C. The character string A preferably includes a number $z_1$ of characters, the character string B preferably includes a number $z_2$ of characters, and the character string C preferably includes a number $z_3$ of characters, where $z_1$ is an integer that is equal to or greater than zero and $z_2$ and $z_3$ are both natural numbers. The method preferably includes the steps of forming a photoresist layer on the surface of one of the plate members, performing a first exposure process and performing a second exposure process. The first exposure process is preferably performed in such a manner that latent images of the character strings A and C are formed in each of multiple subdivided regions of the photoresist layer. The second exposure process is preferably performed in such a manner that latent images of one of the characters of the character string B are formed in predetermined portions of the multiple subdivided regions of the photoresist layer and then latent images of another character of the character string B are formed in the predetermined portions.

In this particular preferred embodiment, the step of performing the first exposure process preferably includes the step of forming the latent images of mutually different character strings C in the multiple subdivided regions of the photoresist layer.

Specifically, the multiple subdivided regions of the photoresist layer are preferably arranged in columns and rows. Supposing the character string C that is allocated to one of the multiple subdivided regions is located at an intersection between an $M^{th}$ row and an $N^{th}$ column (where M and N are both natural numbers) and is identified by $C_{MN}$, $M \neq J$ and/or $N \neq K$ (where J and K are both natural numbers), $C_{MN} \neq C_{JK}$ is preferably satisfied.

More particularly, supposing the character string A that is allocated to one of the multiple subdivided regions is located at the intersection between the $M^{th}$ row and the $N^{th}$ column (where M and N are both natural numbers) and is identified by $A_{MN}$, $M \neq J$ and/or $N \neq K$ (where J and K are both natural numbers), $A_{MN} = A_{JK}$ is preferably satisfied.

In yet another preferred embodiment, the step of performing the first exposure process preferably includes the step of exposing the photoresist layer to the radiation by using at least one photomask of a first type having an opaque pattern that defines the character strings A and C. On the other hand, the step of performing the second exposure process preferably includes the step of exposing the photoresist layer to the radiation by using at least one photomask of a second type having an opaque pattern that defines the characters of the character string B.

In yet another preferred embodiment, the step of performing the first exposure process may include the step of forming the latent images of the character strings A and C over the entire surface of the photoresist layer by using a mask aligner.

In yet another preferred embodiment, the step of performing the second exposure process may include the step of forming the latent images of the character strings B in one of multiple divided regions of the photoresist layer after another by using a stepper. In that case, each of the multiple divided regions of the photoresist layer is preferably wider than each of the multiple subdivided regions of the photoresist layer and preferably includes the multiple subdivided regions of the photoresist layer.

In this particular preferred embodiment, the step of forming the latent images preferably includes the step of forming the latent images of one type of character strings B in one of the divided regions of the photoresist layer and then forming the latent images of another type of character strings B in another one of the divided regions of the photoresist layer.

Yet another preferred embodiment of the present invention provides a method of patterning a photoresist layer. The method preferably includes the steps of preparing the plate member including the photoresist layer that has been exposed to the radiation by the method according to any of the preferred embodiments of the present invention described above, and developing the photoresist layer.

Yet another preferred embodiment of the present invention provides a method of recording an identifier on a plate member. The method preferably includes the steps of preparing the plate member including the photoresist layer that has been patterned by the patterning method according to the preferred embodiment described above, and transferring the pattern of the identifier onto the surface of the plate member by using the patterned photoresist layer as a mask.

In one preferred embodiment of the present invention, the step of transferring the pattern of the identifier may include the step of selectively etching away surface portions of the plate member that are not covered with the patterned photoresist layer.

In an alternative preferred embodiment, the step of transferring the pattern of the identifier may include the step of forming convex portions on surface regions of the plate member that are not covered with the patterned photoresist layer.

In another alternative preferred embodiment, the step of transferring the pattern of the identifier may include the step of modifying surface regions of the plate member that are not covered with the patterned photoresist layer by exposing the surface regions to an energy beam.

Yet another preferred embodiment of the present invention provides a method of manufacturing electronic components. The method preferably includes the steps of preparing the plate member on which the identifiers have been recorded by the recording method according to any of the preferred embodiments of the present invention described above, depositing a thin film on a selected surface of the plate member, and dicing the plate member into multiple divided elements.

In one preferred embodiment of the present invention, the method preferably further includes the step of recording the identifiers on the plate member so that each of the divided elements has one of the identifiers on the surface thereof.

In this particular preferred embodiment, the step of recording the identifiers preferably includes the step of recording the identifiers on the plate member so that each of the divided elements has a unique identifier on the surface thereof.

Yet another preferred embodiment of the present invention provides a set of photomasks for use to transfer the pattern of an identifier onto a photoresist layer. The identifier preferably includes a group of character strings having character strings A and B. The character string A preferably includes a number $z_1$ of characters and the character string B preferably includes a number $z_2$ of characters, where $z_1$ is an integer that is equal to or greater than zero and $z_2$ is a natural number. The set preferably includes a plurality of photomasks of a first type and a plurality of photomasks of a second type. In an opaque pattern of each of the photomasks of the first type, multiple openings, defining the character strings A, are preferably arranged periodically in X-axis and Y-axis directions. In an opaque pattern of each of the photomasks of the second type on the other hand, multiple openings, defining one of the characters of the character string B, are preferably arranged periodically in the X-axis and Y-axis directions.

In one preferred embodiment of the present invention, multiple openings, defining character strings C, are preferably arranged periodically in the X-axis and Y-axis directions in the opaque pattern of each of the photomasks of the first type. Each of the character strings C preferably includes a number $z_3$ of characters, where $z_3$ is a natural number.

Other features, elements, processes, steps, characteristics and advantages of the present invention will become more apparent from the following detailed description of preferred embodiments of the present invention with reference to the attached drawings.

BRIEF DESCRIPTION OF THE DRAWINGS

FIGS. 8A through 8E are cross-sectional views illustrating various methods of recording an identifier on a wafer including a developed photoresist layer thereon wherein:

FIG. 8A illustrates the wafer including the photoresist layer that has just been developed.

FIG. 8B illustrates the wafer that has been subjected to an etching process.

FIGS. 8C and 8D illustrate a lift-off process.

FIG. 8E illustrates a surface altering process.

FIG. 9A illustrates an identifier for use in a second specific preferred embodiment of the present invention.

FIG. 9B is a plan view illustrating a wafer on which identifiers have been recorded according to the second preferred embodiment of the present invention.

FIG. 9C is plan view illustrating a configuration for a photomask of a first type for use in the second preferred embodiment of the present invention.

DETAILED DESCRIPTION OF PREFERRED EMBODIMENTS

Hereinafter, a first specific preferred embodiment of the present invention will be described with reference to the accompanying drawings. In the first preferred embodiment, mutually different identifiers are recorded on multiple ceramic wafers.

Figures 3A, 3B, 3C:
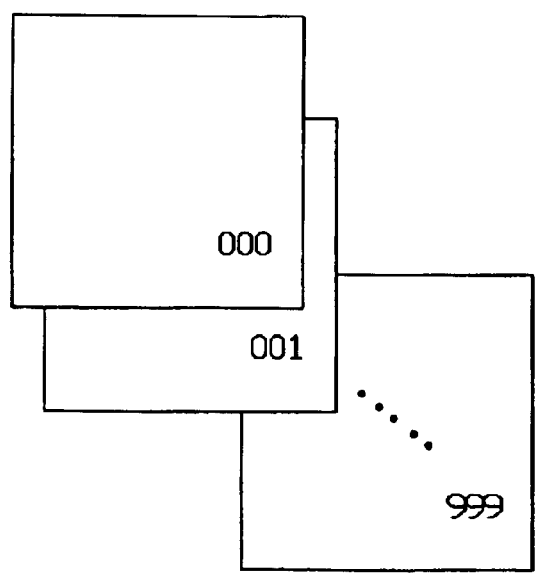
FIG. 3A shows an exemplary identifier.
FIG. 3B shows a situation where multiple different types of identifiers are recorded on multiple wafers so that identifiers of the same type are written at multiple locations on each wafer.
FIG. 3C shows a situation where multiple different types of identifiers are recorded on multiple wafers so that a single identifier is written at one location on each wafer.

In this preferred embodiment, the identifier to be recorded on each of the wafers is represented by a group of character strings including a character string A including a number $z_1$ of characters and a character string B including a number $z_2$ of characters, where $z_1$ and $z_2$ are both natural numbers. In the following illustrative preferred embodiment, the character string A is supposed to be a one-digit character string consisting of just one character A1 and the character string B is supposed to be a two-digit character string including two characters B1 and B2 as shown in FIG. 3A for the sake of simplicity. Also, each of these characters A1, B1 and B2 is preferably one of the ten Arabic numerals of 0 through 9. That is to say, 1,000 different types of identifiers (i.e., "000" through "999") can be represented by the combinations of these character strings A and B. In this preferred embodiment, each of the characters included in the character strings is supposed to be an Arabic numeral for illustrative purposes only. However, those characters may also be alphabets, Japanese syllabic scripts ("hiragana" or "katakana"), Chinese characters ("kanji"), symbols, or whatever belongs to a coding unit that can represent the identifier. It should also be noted that although a character string including a number n of characters (where n is a natural number) will be herein referred to as an "n-digit character string", not all of these characters have to be Arabic numerals but some of them may be a symbol of one of those types. Therefore, the "digit" does not herein always mean a numeral.

The identifiers AB are preferably inscribed on multiple locations of each wafer as shown in FIG. 3B. Optionally, the identifier AB may also be written on just one location of each wafer as shown in FIG. 3C. If the identifiers are recorded on the wafers as shown in FIG. 3C, the identifiers are effective while various manufacturing and processing steps are carried out on a wafer-by-wafer basis. However, once each wafer has been diced into multiple chips, the identifiers are no longer effective.

To inscribe 1,000 different types of identifiers on 1,000 wafers by the conventional photolithographic process, 1,000 photomasks (or reticles) are needed. In that case, mutually different identifiers should be allocated to the respective photomasks. For example, an opaque pattern defining a character string "150" is formed on a $150^{th}$ photomask.

In contrast, according to this preferred embodiment, a positive photoresist layer is subjected to multiple exposure processes by using a set of photomasks including two types of photomasks (i.e., photomasks of a first type and photomasks of a second type). In this manner, the identifiers required can be inscribed on the same number of wafers by using a far smaller number of photomasks.

Hereinafter, photomasks for use in this preferred embodiment will be described with reference to FIGS. 4A and 4B.

Figure 4A:
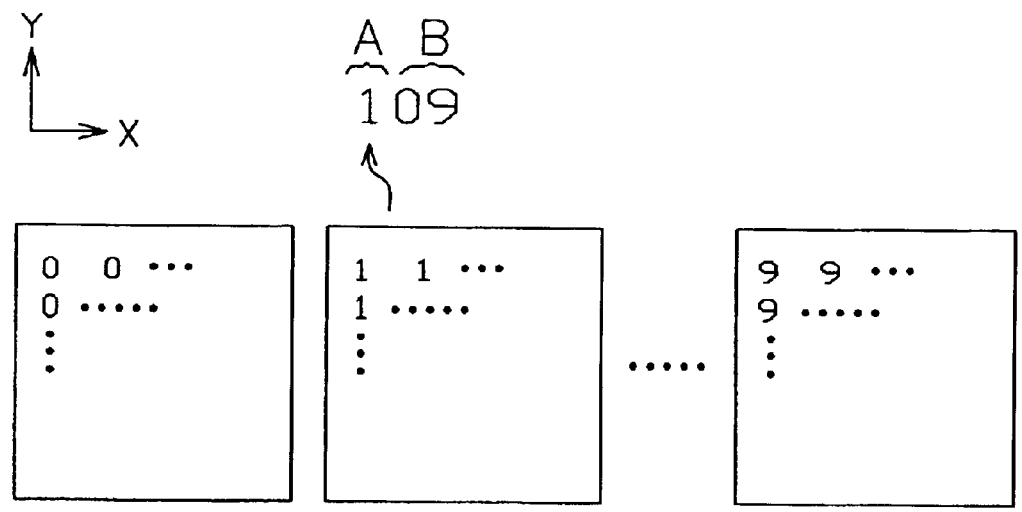
FIG. 4A schematically illustrates a configuration for photomasks of a first type according to a first specific preferred embodiment of the present invention.

First, referring to FIG. 4A, illustrated are photomasks of the first type for use in this preferred embodiment. Each of the photomasks of the first type includes multiple opaque patterns each defining the character string A. As used herein, the "opaque pattern defining the character string A" refers to a pattern in which the character portion(s) of the character string A is/are defined by the opening(s) of an opaque layer on the photomask. In FIGS. 4A and 4B, the white portions of each photomask represent the opaque layer while the black characters (or numerals) represent the openings of the opaque layer.

In writing multiple different types of identifiers on multiple wafers so that the identifiers of the same type are recorded on a plurality of regions of each wafer as shown in FIG. 3B, the opaque patterns defining the character strings A are arranged periodically in the X-axis and Y-axis directions on each photomask of the first type. In the preferred embodiment illustrated in FIG. 4A, the character A1 is disposed on each region on which the identifier should be written. In this specific example, the character A1 is one of the Arabic numerals of "0" through "9", thus requiring ten different photomasks of the first type. If each character string A consists of two digits, 100 different photomasks of the first type will be needed to represent 100 types of character strings of "00" through "99".

Figure 4B:
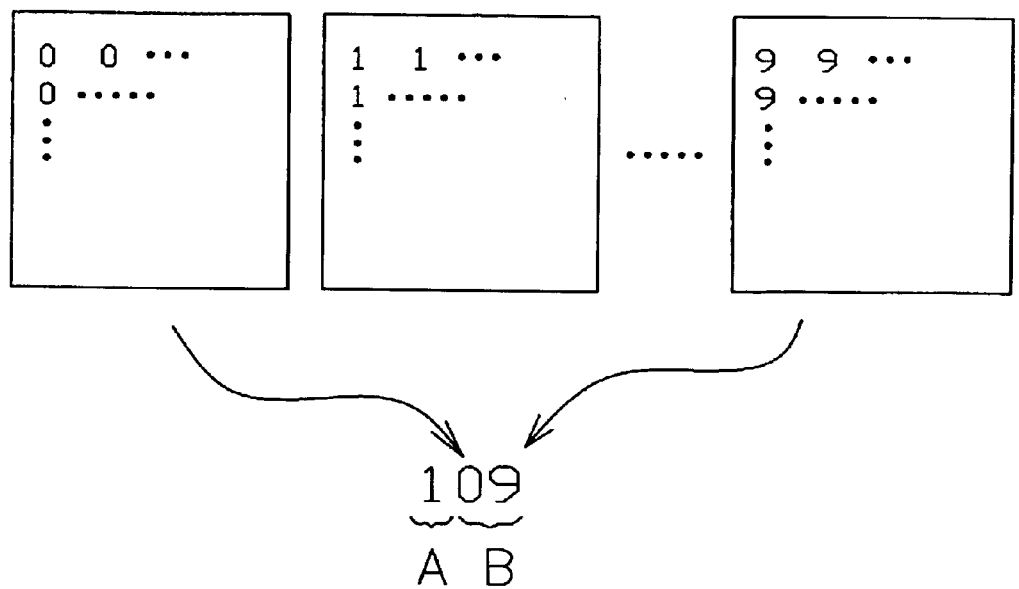
FIG. 4B schematically illustrates a configuration for photomasks of a second type according to the first preferred embodiment of the present invention.

On each of the photomasks of the second type on the other hand, patterns, each defining one of the characters of the character string B, are preferably arranged periodically in the X-axis and Y-axis directions as shown in FIG. 4B. The pitch between two adjacent one-digit characters is substantially equal to the pitch between two adjacent character strings A. Each of the photomasks of the second type is disposed so that each character on the photomask of the second type is aligned with a non-exposed region of its associated photomask of the first type as defined by the opaque layer thereof.

In the example illustrated in FIGS. 4A and 4B, each pair of photomasks of the first and second types has the same opaque patterns. In this case, each photomask of the first type may also be used as a photomask of the second type. However, not every pair of photomasks of the first and second types has to have the same opaque patterns. For example, one of the photomasks of the first type may define an alphabet, while associated one of the photomasks of the second type may define an Arabic numeral.

Hereinafter, it will be described with reference to FIGS. 5A through 7D how to carry out exposure processes using the set of photomasks.

Figure 5A:
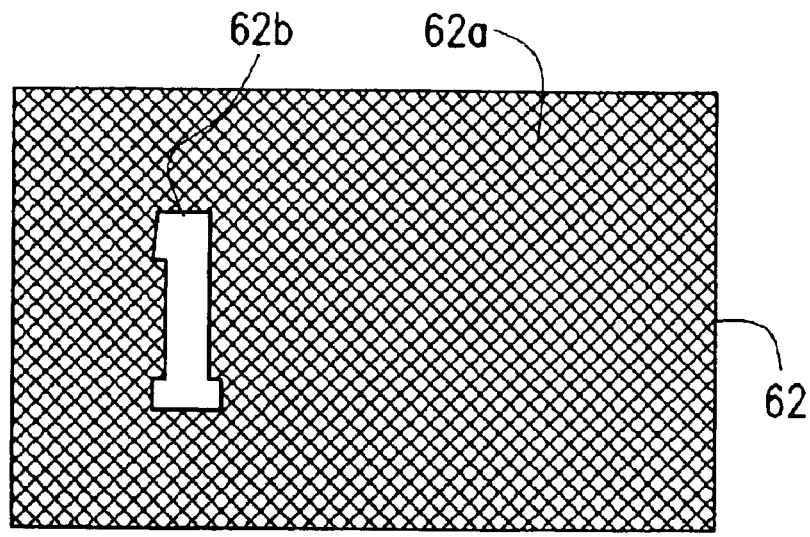
FIG. 5A is a plan view illustrating a portion of a photomask of the first type according to the first preferred embodiment of the present invention.

In this specific example, a photomask 62 of the first type shown in FIG. 5A is used. On this photomask 62, an opaque pattern 62a defining a character A1 has been formed. A photomask like this can be obtained by depositing a metal or resin film having opacity on a transparent substrate of glass, for example, and then removing the character portions from the film. As shown in FIG. 5A, the opening 62b of the opaque pattern 62a has a shape corresponding to a character to be represented. FIG. 5A illustrates only the opaque pattern 62a for just one identifier for the sake of simplicity. Actually, though, a great number of similar opaque patterns 62a are arranged on the single photomask 62.

Figure 5B:
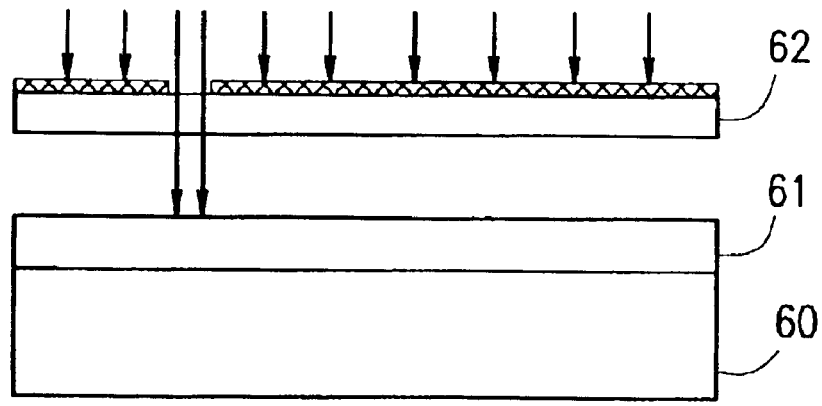
FIGS. 5B and 5C are cross-sectional views illustrating a first exposure process that is carried out by using the photomask of the first type shown in FIG. 5A.
Figure 5C:
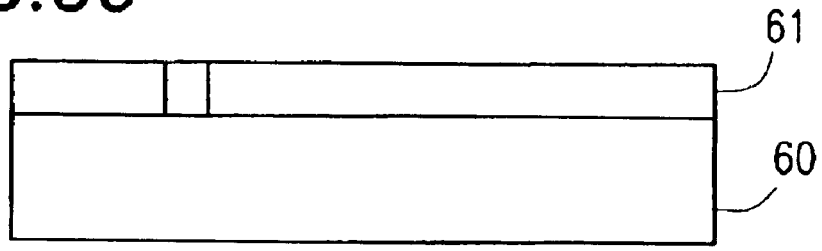

Next, as shown in FIG. 5B, a wafer 60 that has been coated with a positive photoresist layer 61 is prepared. The photoresist layer 61 on the wafer 60 is exposed to a radiation through the photomask 62 of the first type. As a result of this first exposure process, latent images of the patterns 62a defining the character A1 (more exactly, latent images having the shape of the opening 62b) are formed in multiple regions of the photoresist layer 61. More specifically, the character A1 representing one of the Arabic numerals of 0 through 9 (e.g., "1" in the specific example illustrated in FIG. 5A) is exposed to the radiation. Accordingly, the photoresist layer 61 is partially exposed to the radiation that has been transmitted through the opening 62b of the opaque pattern 62a. In FIG. 5C, the exposed portion of the positive photoresist layer 61 is indicated by dots. Since a positive photoresist material is used in this specific example, the exposed portion of the positive photoresist layer 61 will be dissolved in a developer and form an opening in a developing process step to be performed later. As a result, portions of the photoresist layer 61 corresponding to the characters will be removed in this preferred embodiment.

It should be noted that an aligner is preferably used in this first exposure process to form latent images defining the character strings A over the entire surface of the wafer 60.

Figure 6A:
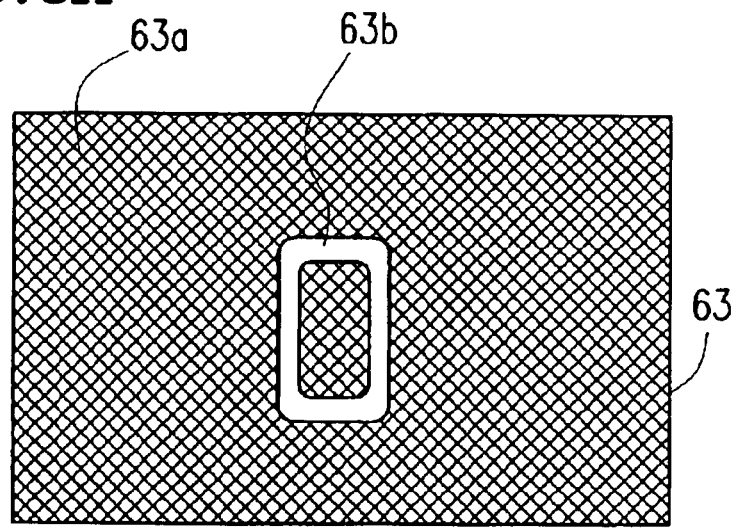
FIG. 6A is a plan view illustrating a portion of a photomask of the second type according to the first preferred embodiment of the present invention.

Subsequently, before the developing process step is performed, the character string B is written. Specifically, an appropriate photomask of the second type is selected from the ten photomasks of the second type shown in FIG. 4B. By using the photomask selected, the latent images of the characters B1 are formed in the photoresist layer 61. FIG. 6A illustrates a portion of the photomask 63 selected. As shown in FIG. 6A, the photomask 63 of the second type includes an opaque pattern 63a defining the character of the character string B. The opaque pattern 63a includes an opening 63b having a shape corresponding to that of the character B1.

Figure 6B:
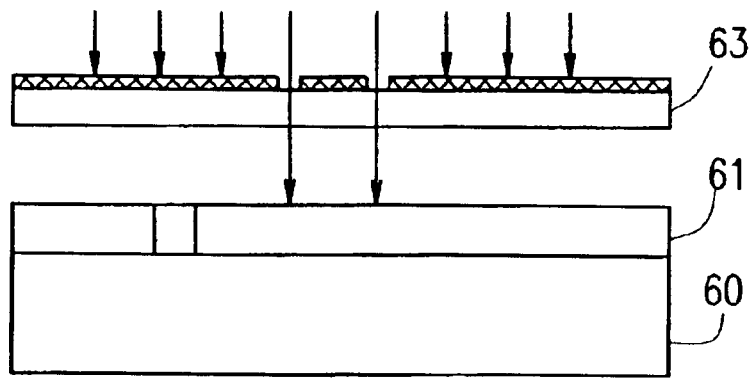
FIGS. 6B and 6C are cross-sectional views illustrating a second exposure process that is carried out by using the photomask of the second type shown in FIG. 6A.
Figure 6C:
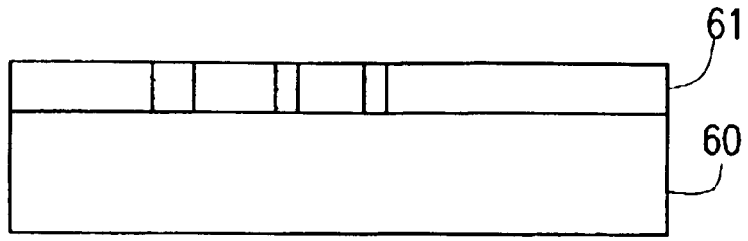

By aligning the photomask 63 of the second type with the photoresist layer 61 appropriately, the location of the character B1 can be properly defined with respect to the latent image of the character A1, thereby exposing a selected portion of the photoresist layer 61 to the radiation as shown in FIG. 6B. No portions of the photoresist layer 61, except its portions corresponding to the character strings A, were exposed to the radiation in the process step shown in FIG. 5B. Accordingly, when the photoresist layer 61 is exposed to the radiation that has passed through the pattern 63a defining the character B1, a latent image corresponding to the opening 63b of the opaque pattern 63a is formed as shown in FIG. 6C.

Figure 7A:
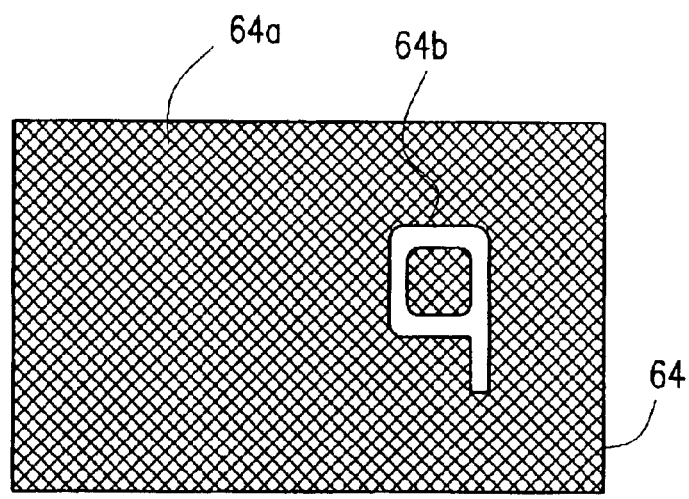
FIG. 7A is a plan view illustrating a portion of another photomask of the second type according to the first preferred embodiment of the present invention.
Figure 7B:
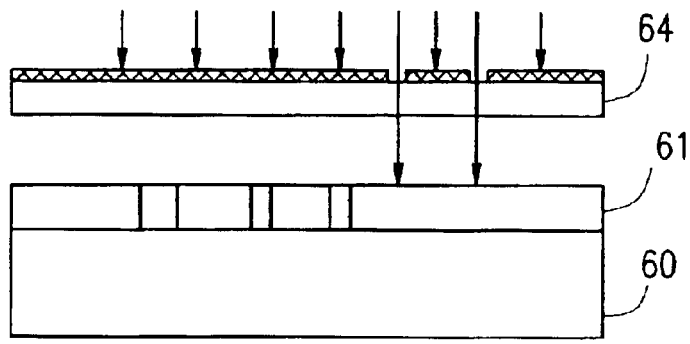
FIGS. 7B and 7C are cross-sectional views illustrating the second exposure process that is carried out by using the photomask of the second type shown in FIG. 7A.
Figure 7C:
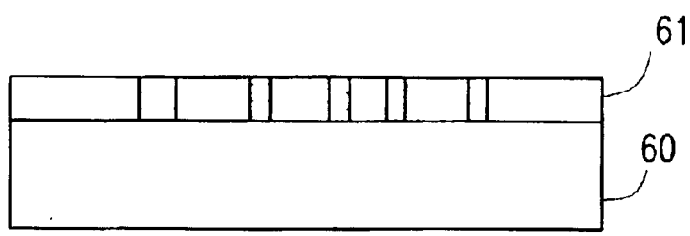

Next, a third exposure process is carried out as shown in FIGS. 7A through 7D. When the second exposure process shown in FIGS. 6A through 6C is finished, another appropriate photomask 64 of the second type is selected from the ten photomasks of the second type shown in FIG. 4B. By using the photomask 64 selected, the latent image of the character B2 is formed in the photoresist layer 61. As shown in FIG. 7A, the photomask 64 of the second type includes an opaque pattern 64a defining the character of the character string B. The opaque pattern 64a includes an opening 64b having a shape corresponding to that of the character B2. By aligning the photomask 64 of the second type with the photoresist layer 61 appropriately, the location of the character B2 can be properly defined with respect to the latent image of the character A1, thereby exposing a selected portion of the photoresist layer 61 to the radiation as shown in FIG. 7B. Accordingly, when another unexposed region of the photoresist layer 61 is exposed to the radiation that has passed through the pattern 64a defining the character B2, a latent image, corresponding to the opening 64b of the opaque pattern 64a, is formed in the photoresist layer 61 as shown in FIG. 7C.

Figure 7D:
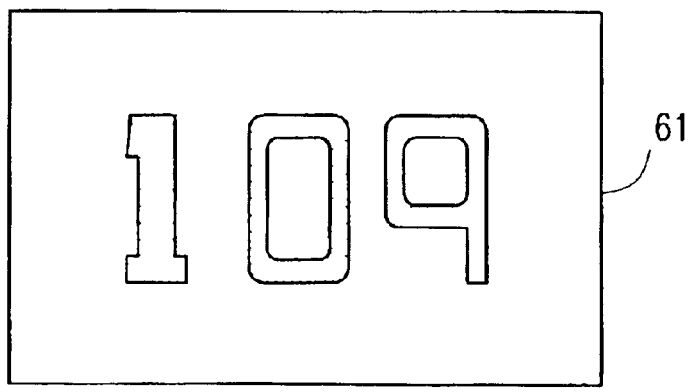
FIG. 7D is a plan view illustrating a photoresist layer that has been subjected to the first and second exposure processes.
Figure 8A:
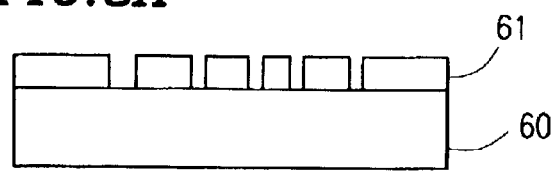

By performing these exposure processes, the identifier shown in FIG. 7D is written on each of multiple regions of the positive photoresist layer 61. Thereafter, when the positive photoresist layer 61 is subjected to the developing process, the exposed portions (i.e., the dotted portions) are removed from the photoresist layer 61 and openings that define the intended characters are formed in the photoresist layer 61. FIG. 8A schematically illustrates a cross section of the positive photoresist layer 61 that has been developed.

Hereinafter, various methods of recording the identifiers on the wafer 60 by using the patterned photoresist layer 61 (which will be herein also referred to as a "resist pattern") will be described with reference to FIGS. 8B through 8E.

Figure 8B:
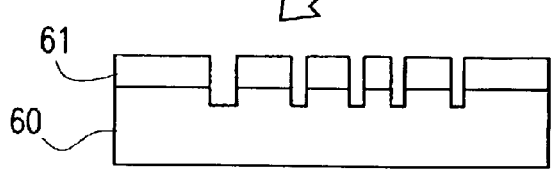

First, a method utilizing an etching technique will be described. In this case, the wafer 60 including the resist pattern 61 thereon is loaded into an etcher (not shown) so that the surface of the wafer 60 reacts with an appropriate etchant or etching gas. Then, surface portions of the wafer 60 that are not covered with the resist pattern 61 are etched away, thereby transferring the character strings A and B onto the wafer 60 as shown in FIG. 8B. The conditions of this etching process are appropriately selected depending on the material of the wafer 60 to be etched. The etching process may be either a dry etching process such as a plasma-enhanced reactive ion etching (RIE) process or a wet etching process or other suitable process.

Figure 8E:
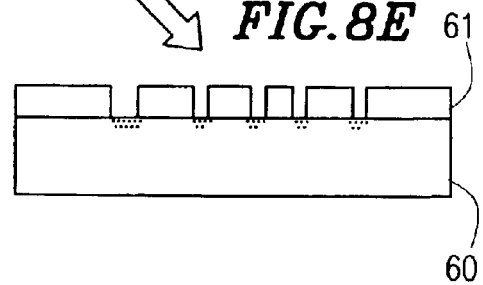
Figure 8C:
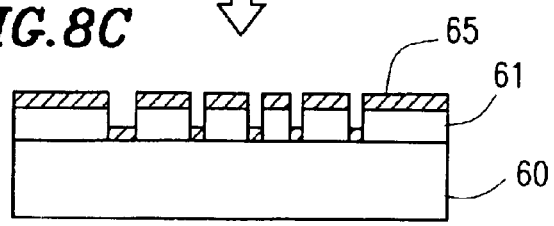
Figure 8D:
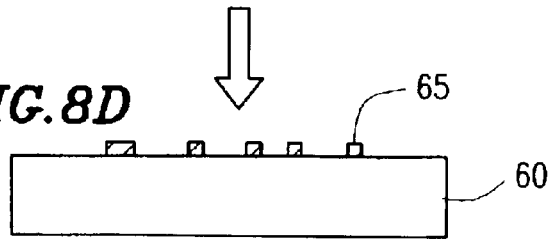

The techniques of recording the identifiers on the wafer 60 by using the developed and patterned photoresist layer 61 are not limited to the etching process described above. For example, as shown in FIG. 8C, a thin film 65 of a metal, for example, may be deposited over the wafer 60 that is partially covered with the resist pattern (i.e., the patterned photoresist layer) 61 and then the resist pattern 61 may be stripped along with the excessive portions of the thin film 65. Even so, the identifiers can also be transferred onto the wafer 60. A technique such as this is called a "lift-off" process. In this technique, the excessive portions of the thin film 65 that have been deposited on the resist pattern 61 are removed from the surface of the wafer 60 along with the resist pattern 61. As a result, the other portions of the thin film 65 that were located inside the openings of the resist pattern 61 (i.e., portions defining the characters in this preferred embodiment) are left on the surface of the wafer 60, thereby forming raised character portions that protrude from the surface of the wafer 60 as shown in FIG. 8D.

The identifiers may also be recorded by any technique other than the methods of forming the embossed patterns on the surface of the wafer (including the etching and lift-off processes described above). For example, as shown in FIG. 8E, the bare surface portions of the wafer 60 that is still covered with the resist pattern 61 may be irradiated with, and modified by, an energy beam such as an ion beam. Even so, the identifiers can also be transferred onto the wafer 60. When those surface portions of the wafer 60 are modified, the reflectance, conductivity and other physical parameters thereof change. Accordingly, by detecting such changes, the identifiers can also be read from the wafer.

It should be noted that if the wafer 60 is made of a composite material including $Al_2O_3$ and TiC (e.g., $Al_2O_3$—TiC type ceramic), the wafer 60 is preferably etched selectively by the method that was disclosed by the applicant of the present application in the description and the drawings of Japanese Patent Application No. 2000-239431. According to the selective etching process, embossed patterns having a very small depth are formed on the surface of the character portions. Thus, even though the etched portions have a small depth, the difference in reflectance between the character portions and the non-character portions is so great as to read the identifiers easily.

It should also be noted that the character string A may be omitted from the identifier. When the character string A is omitted, the number $z_1$ of characters included in the character string A is zero. Accordingly, in this preferred embodiment, each identifier may be represented by a group of character strings having a character string A including a number $z_1$ of characters (where $z_1$ is an integer that is equal to or greater than zero) and a character string B including a number $z_2$ of characters (where $z_2$ is a natural number).

If the character string A includes multiple characters (e.g., characters A1 and A2), those characters A1 and A2 do not have to be adjacent to each other on the wafer. For example, the characters A1 and A2 may interpose the character string B between them. Also, where the character string A is made up of a plurality of characters A1 through An, those characters A1 through An do not have to be arranged in line. For example, the characters A1 through An may be arranged either two-dimensionally in columns and rows or to form a curved pattern. As for possible arrangements of characters, the same statement is true of the character string B.

Hereinafter, a second specific preferred embodiment of the present invention will be described.

In this second preferred embodiment, an identifier to be recorded on each wafer has a character string B including a number $z_2$ of characters and a character string C including a number $z_3$ of characters (where $z_2$ and $z_3$ are both natural numbers).

Figure 1A:
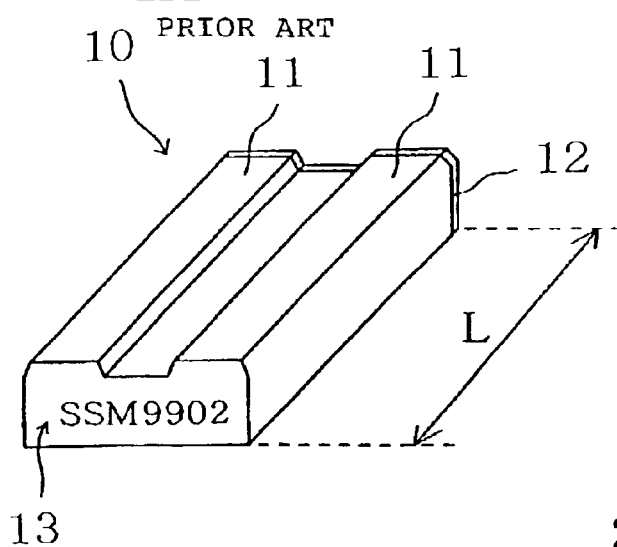
FIG. 1A is a perspective view of a slider for a magnetic head.
Figure 1B:
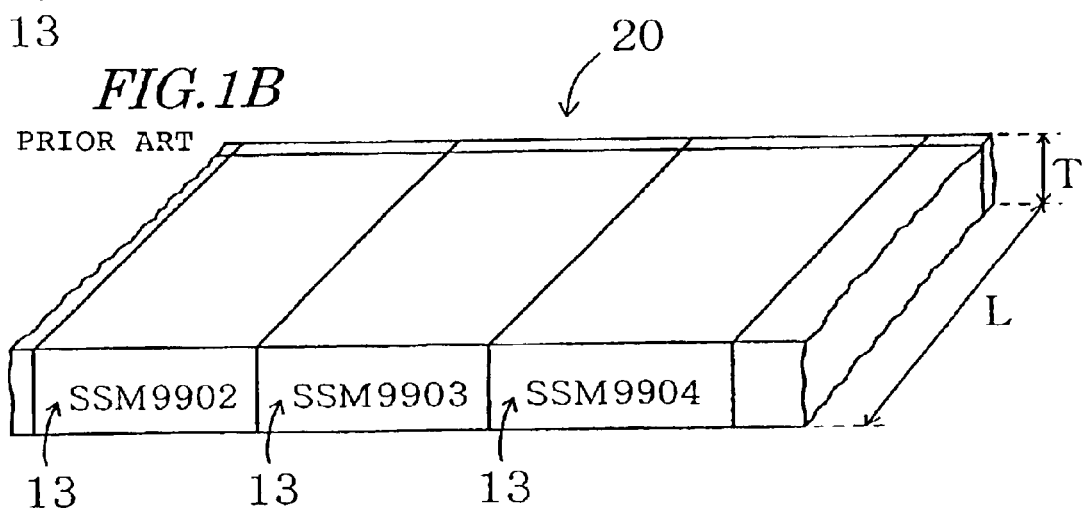
FIG. 1B is a perspective view illustrating a bar yet to be divided into multiple sliders for a magnetic head.
Figure 1C:
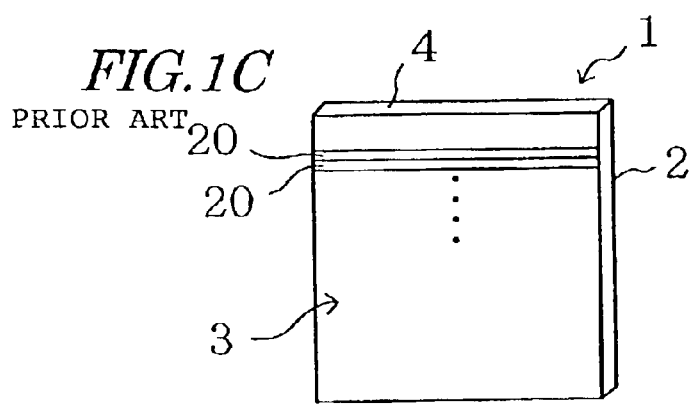
FIG. 1C is a perspective view illustrating a substantially rectangular sintered wafer.
Figure 2:
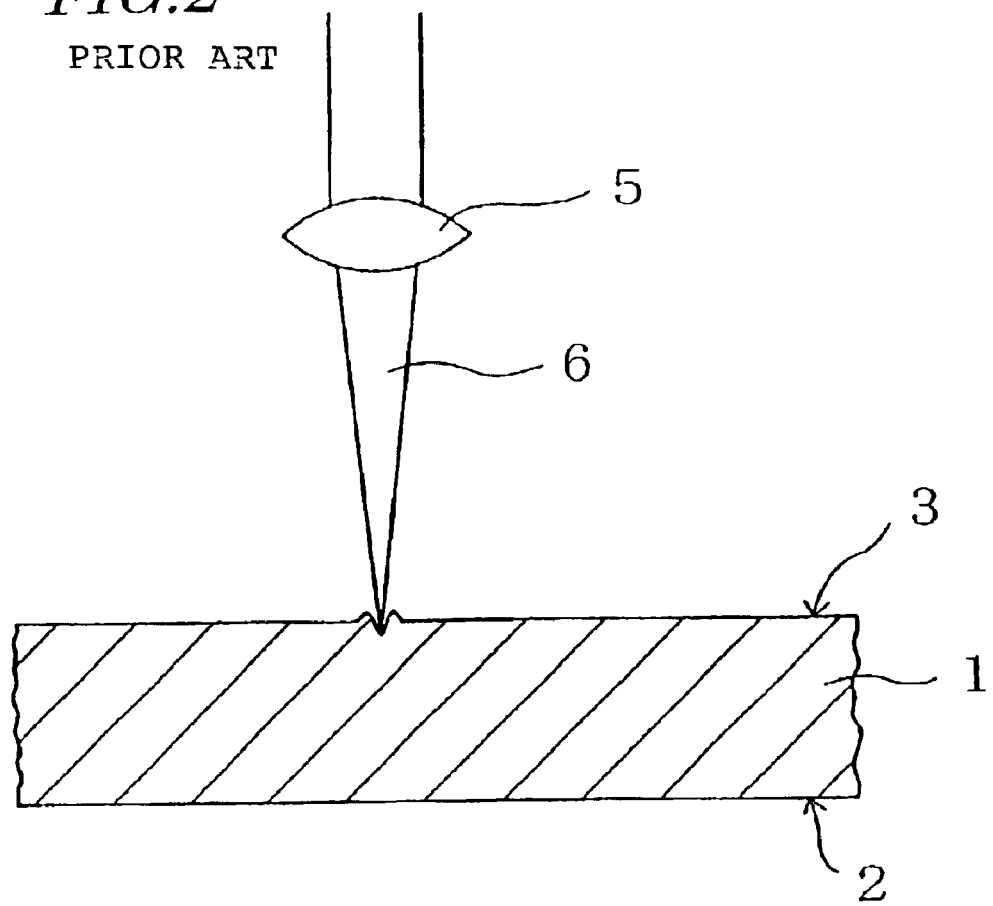
FIG. 2 schematically illustrates a conventional laser marking process.

The second preferred embodiment of the present invention relates to a method of recording multiple identifiers, including mutually different character strings C, at various locations on a single wafer. If those different identifiers are provided for respective regions of one wafer, multiple divided elements, obtained by dicing one wafer as shown in FIGS. 1A through 1C, can have their own identifiers.

In this specific example, a four-digit identifier is supposed to be recorded as shown in FIG. 9A for the sake of simplicity. As shown in FIG. 9A, the character string B of this identifier includes two characters B1 and B2, while the character string C thereof includes two characters C1 and C2. In the example illustrated in FIGS. 9A through 9C, each of the characters B1 and B2 may be one of the twenty-six alphabets of "a" through "z" and each of the characters C1 and C2 may be one of the ten Arabic numerals of "0" through "9". That is to say, $26^2 \times 10^2$ different types of identifiers (i.e., "aa00" through "zz99") can be represented by combining the character strings B and C in various manners. In this case, the two-digit character strings C may be used to provide mutually different pieces of identification information for 100 regions that are arranged in matrix, or in 10 columns and 10 rows. FIG. 9B schematically illustrates a wafer plane on which those identifiers have been recorded. If the number of characters per character string C is increased, it is naturally possible to provide different pieces of identification information for an even greater number of wafer regions.

A character string C, which is allocated to one of the multiple matrix regions that is located at an intersection between an $M^{th}$ row and an $N^{th}$ column (where M and N are both natural numbers), is herein identified by $C_{MN}$. That is to say, $C1 \cdot C2 = C_{MN}$. In this preferred embodiment, if M≠J and/or N≠K (where J and K are both natural numbers), then $C_{MN} \neq C_{JK}$ is satisfied. That is to say, on looking at any given character string C, it can be quickly seen to which column and row position of the wafer the identifier including the character string C is allocated. Thus, the character string C will be herein referred to as a "row-column number". If these identifiers are inscribed on all of multiple divided elements of a wafer, then the original location of any divided element can be specified instantly.

Next, a photomask for use in this preferred embodiment will be described with reference to FIG. 9C.

On the photomask of the first type for use in this preferred embodiment, an opaque pattern defining the characters of the character strings C has been formed. As used herein, the "opaque pattern defining the characters of the character strings C" refers to a pattern in which the character portions of the character strings C are defined by the openings of the opaque layer on the photomask. That is to say, on each photomask of the first type, the openings defining the character strings C are arranged periodically in the X-axis and Y-axis directions.

The character strings C of the second preferred embodiment are different from the character strings A of the first preferred embodiment described above in that the values of the two-digit character strings C are different from one location on a single wafer to another. However, the combination of the character strings C for one wafer does not have to be different from that of the character strings C for another wafer. Accordingly, just one photomask is needed to write the character strings C.

On the other hand, the photomask of the second type for use in this second preferred embodiment may have the same structure as the counterpart of the first preferred embodiment described above. Thus, by using such photomasks of the second type, the characters "a" and "b" shown in FIG. 9B are written on a digit-by-digit basis on the photoresist layer.

Hereinafter, it will be described how to perform exposure processes in this second preferred embodiment of the present invention.

First, a wafer that has been coated with a positive photoresist layer is prepared, and respective regions of the photoresist layer are exposed to the radiation by using the photomask of the first type. As a result of this exposure process, latent images of 100 different character strings C (i.e., "00" through "99") are formed at respectively different locations of the photoresist layer.

Next, an appropriate one is selected from multiple photomasks of the second type, and the latent images of the characters B1 are formed in the photoresist layer by using the selected photomask of the second type. In this case, by aligning the photomask of the second type with the photoresist layer appropriately, the locations of the characters B1 can be properly defined with respect to the latent images of the character strings C. Then, unexposed portions of the positive photoresist layer are exposed to the radiation.

Subsequently, an appropriate one is selected from the multiple photomasks of the second type, and the latent images of the characters B2 are formed in the photoresist layer by using the selected photomask of the second type. In this case, by aligning the photomask of the second type with the photoresist layer appropriately, the locations of the characters B2 can be properly defined with respect to the latent images of the character strings C. Then, other unexposed portions of the positive photoresist layer are exposed to the radiation.

In this manner, the character strings B and C are written on the respective regions of the positive photoresist layer.

Thereafter, the photoresist layer that has been patterned in this manner is developed, thereby removing the exposed portions from the photoresist layer. As a result, openings representing the characters are formed in the photoresist layer.

Next, the wafer including the resist pattern (i.e., the patterned photoresist layer) thereon is loaded into an etcher so that the surface of the wafer reacts with an appropriate etchant or etching gas. Then, surface portions of the wafer that are not covered with the resist pattern are etched away, thereby transferring the character strings B and C onto the wafer.

In the second preferred embodiment described above, each identifier preferably includes no character string A. Alternatively, each identifier may also include the character string A. In that case, the same photomask of the first type may be used to write the character strings A and C on the photoresist layer. However, each of the photomasks of the first type for use to form the character strings A should be provided with the opaque pattern defining the character strings C. Optionally, two different photomasks may be used to form the character strings C and to form the character strings A, respectively.

Hereinafter, a third specific preferred embodiment of the present invention will be described.

In this third preferred embodiment, each identifier is represented by a group of character strings having a character string A including a number $z_1$ of characters, a character string B including a number $z_2$ of characters and a character string C including a number $z_3$ of characters (where $z_1$ is an integer that is equal to or greater than zero and $z_2$ and $z_3$ are both natural numbers).

Figure 10:
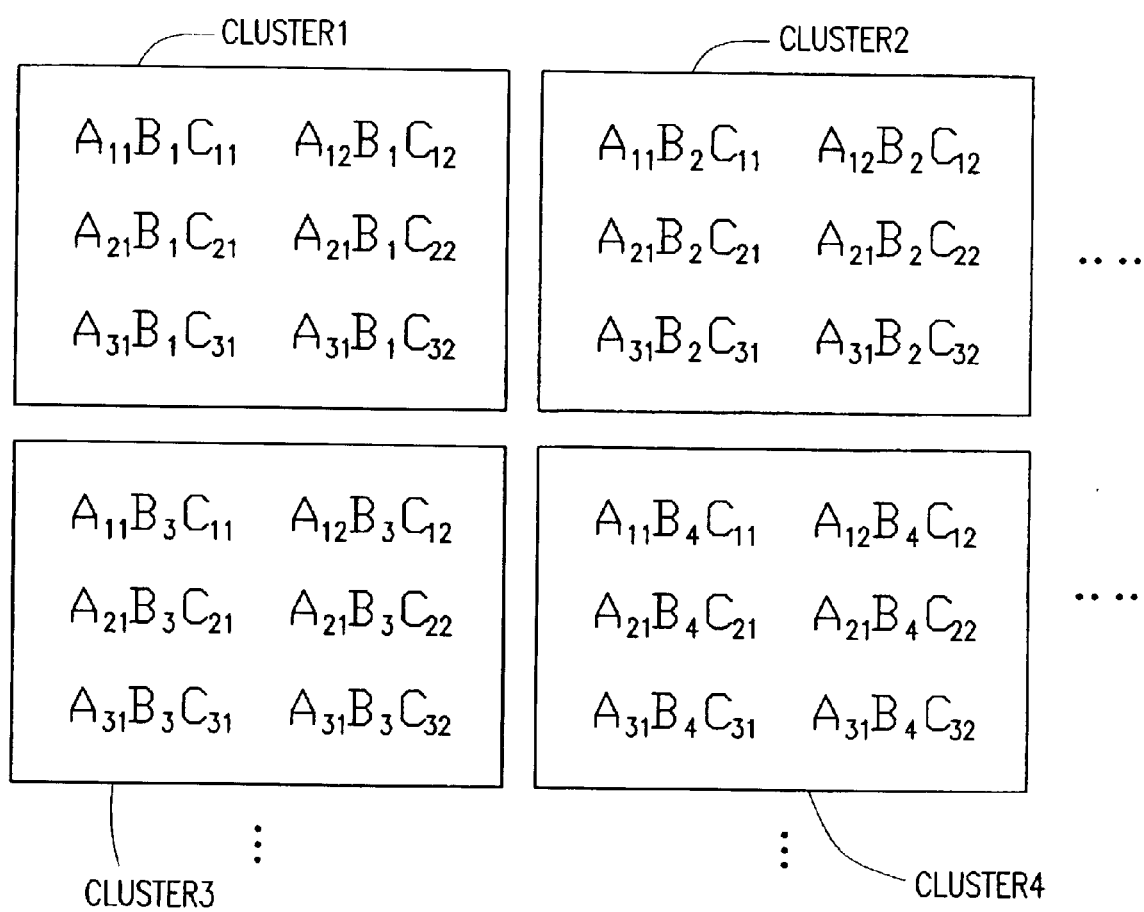
FIG. 10 is a plan view schematically illustrating the arrangement of character string groups for use in a third specific preferred embodiment of the present invention.

In this preferred embodiment, a cluster region is formed by assembling together a plurality of regions, each including the group of character strings A, B and C, as shown in FIG. 10. Multiple cluster regions are allocated to a single wafer so as to have mutually different character strings B. That is to say, the character strings B of one type (e.g., $B_1$) are included in one cluster region (e.g., cluster region No. 1), the character strings B of another type (e.g., $B_2$) are included in another cluster region (e.g., cluster region No. 2), and so on. More specifically, an identifier represented by a group of character strings $A_{MN}B_LC_{MN}$ is recorded at the $M^{th}$ row and $N^{th}$ column in the $L^{th}$ cluster region of one wafer, where L is an integer. Among these character strings $A_{MN}B_LC_{MN}$, the character string $C_{MN}$ at a particular location (i.e., at the $M^{th}$ row and $N^{th}$ column) of one cluster region is the same as the character string $C_{MN}$ at the same location (i.e., at the $M^{th}$ row and $N^{th}$ column) of any other cluster region. However, the character strings $B_L$ of one cluster region are different from the character strings $B_L$ of another cluster region. Accordingly, any cluster region can be specified by the character string $B_L$, and any location inside a cluster region can be specified by the character string $C_{MN}$.

In each cluster region, if M≠J and/or N≠K (where J and K are natural numbers), then either $A_{MN} \neq A_{JK}$ or $A_{MN} \neq A_{JK}$ may be satisfied. The character strings A represent information to identify the wafer where the character strings A belong. As for the character strings $C_{MN}$ on the other hand, if M≠J and/or N≠K (where J and K are natural numbers), then $C_{MN} \neq C_{JK}$ is always satisfied. That is to say, any location inside each cluster region is identifiable by the character string $C_{MN}$, and therefore, the character string $A_{MN}$ at one location inside a cluster region does not always have to be different from the character string $A_{MN}$ at another location inside the same cluster region.

It should be noted that the order of arrangement of the character strings A, B and C and the arrangement of the cluster regions are not limited to those of the specific example illustrated in FIG. 10.

In this preferred embodiment, a first exposure process is carried out by using at least one photomask of the first type so that latent images of the character strings A and C are formed in respective regions of a positive photoresist layer.

Thereafter, a second exposure process is carried out so that latent images of the characters of the character strings B are formed on a digit-by-digit basis in the unexposed regions of the positive photoresist layer. That is to say, the second exposure process preferably includes the same number of process steps as the number of characters per character string B. Thus, each of the character strings $B_L$ does not have to contain just one character.

In the first exposure process, the latent images of the character strings A and C are preferably formed in the entire photoresist layer over the wafer by using an aligner. In the second exposure process on the other hand, the latent images of the character strings B are preferably formed in one cluster region after another by using a stepper. Optionally, the latent images of the character strings A and the latent images of the character strings C may be formed separately by using two different photomasks.

In each of the preferred embodiments of the present invention described above, a positive photoresist material is used. However, the present invention is not limited to those specific preferred embodiments, but can naturally be carried out even by the use of a negative photoresist material. When a negative photoresist material is used, the unexposed portions of the negative photoresist layer are dissolved in a developer. Accordingly, if the photomasks described above and the negative photoresist material are used in combination, then the character portions (i.e., exposed portions) of the negative photoresist layer will remain after the photoresist layer has been developed. And when the wafer is selectively etched by using the patterned negative photoresist layer as an etching mask, the surface of wafer is etched entirely except regions under the character portions. It should be noted, however, that the patterns of identifiers may also be transferred onto the surface of the wafer without etching the surface of the wafer. For example, if a lift-off process is carried out using a patterned negative photoresist layer, then the character portions may be recessed ones.

Figure 11A:
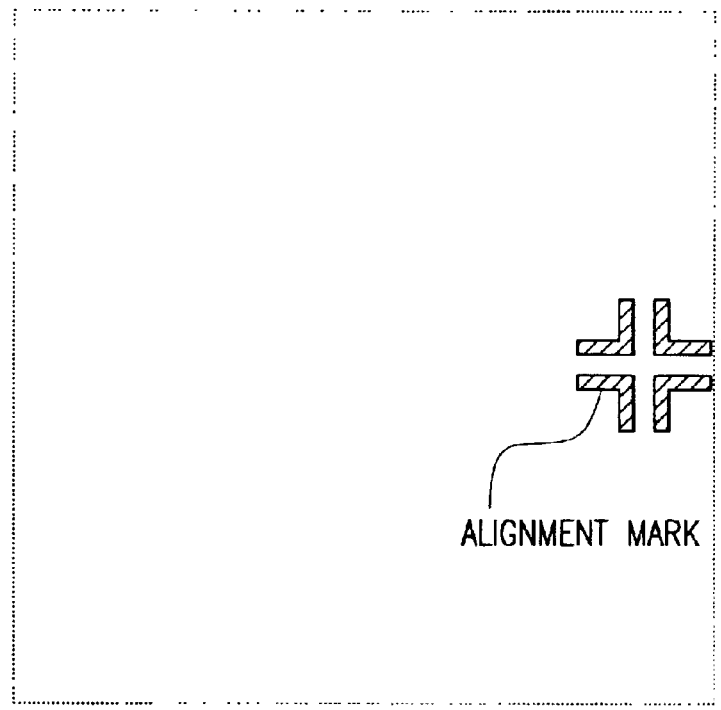
FIGS. 11A and 11B are plan views illustrating how alignment marks may be laid out in a preferred embodiment of the present invention.
Figure 11B:
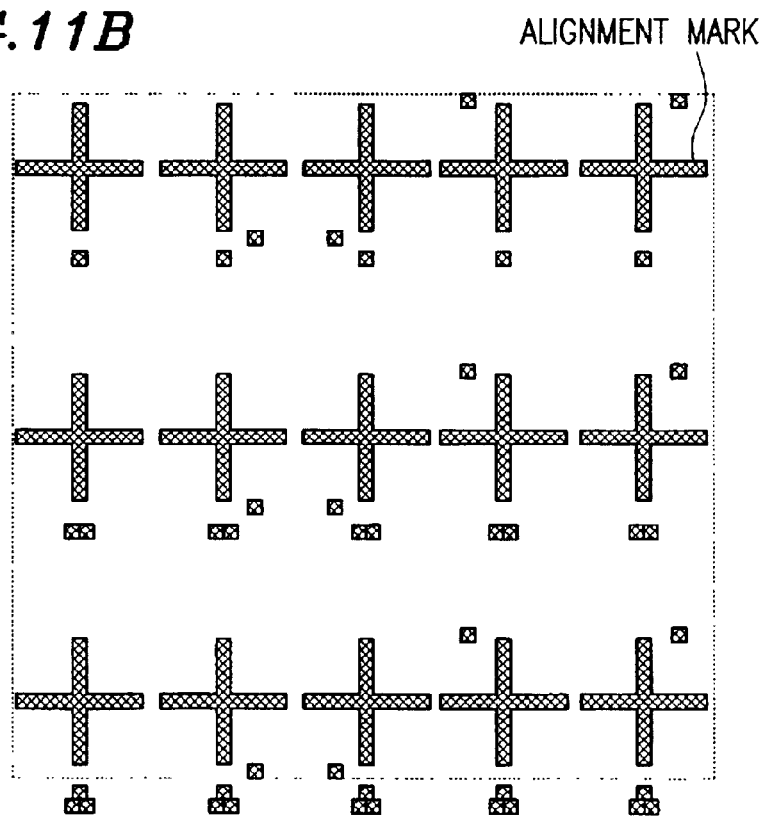

Each photomask is preferably aligned with a photoresist layer by reference to an alignment mark on a wafer. For example, an alignment mark such as that shown in FIG. 11A is preferably formed on the wafer beforehand. An alignment mark like this is preferably a resist pattern. On the other hand, each photomask of the first or second type is also preferably provided with another type of alignment marks as shown in FIG. 11B so that one of the alignment marks of the photomask can be aligned with the alignment mark on the wafer. When multiple alignment marks are formed on the photomask as shown in FIG. 11B, the mask alignment process can be performed highly accurately.

Various preferred embodiments of the present invention are effectively applicable for use not only in a ceramic wafer but also in a plate-type member of any other material. Also, although the plate-type member of the preferred embodiments described above preferably has the shape of a wafer, the plate-type member may also be a member having any other arbitrary shape as long as the member has a surface having two dimensions that are large enough to write the identifiers thereon. The surface on which the identifiers are written does not have to be a flat surface but may also be a curved surface. Furthermore, the identifiers are preferably written on flat regions, but not the entire surface of the plate-type member has to be flat. Accordingly, some sort of uneven or stepped portions may preexist on the remaining regions of the plate-type member other than the regions on which the identifiers should be written.

Furthermore, the process step of recording the identifiers on a ceramic wafer or a silicon wafer does not have to be performed before the process steps of depositing various thin films on the wafer are started. Alternatively, the identifiers may also be recorded on the wafer either during a series of thin film deposition and patterning process steps or at an arbitrary point in time after those process steps are finished.

According to various preferred embodiments of the present invention described above, a variety of identifiers can be recorded on multiple plate-type members by using a much smaller number of photomasks. Thus, the unwanted increase in manufacturing cost due to the use of many expensive photomasks is avoidable.

Thus, various preferred embodiments of the present invention described above are effectively applicable for use in a manufacturing process that includes the process step of dicing a plate-type member such as a wafer into multiple divided elements.

While the present invention has been described with respect to preferred embodiments thereof, it will be apparent to those skilled in the art that the disclosed invention may be modified in numerous ways and may assume many embodiments other than those specifically described above. Accordingly, it is intended by the appended claims to cover all modifications of the invention that fall within the true spirit and scope of the invention.

What is claimed is:

1. A method of recording mutually different identifiers on multiple plate members, each said identifier including a group of character strings having character strings A and B, the character string A including a number $z_1$ of characters, the character string B including a number $z_2$ of characters, where $z_1$ is a natural number greater than 1 and $z_2$ is a natural number, the method comprising the steps of:

(a) preparing a photomask of a first type having an opaque pattern that defines the character string A, where, if there are S possible symbols for each character in the character string A, then the number of photomasks needed to form each possible character string A is $S^{z_1}$;

(b) preparing at least one photomask of a second type having an opaque pattern that defines one of the characters of the character string B, where, if there are T possible symbols for each character in the character B, then the number of photomasks needed to form each possible character string B is T;

(c) forming a photoresist layer on the surface of one of the plate members;

(d) forming a latent image of the character string A in the photoresist layer in a single radiation exposure step by using the photomask of the first type; and (e) forming a latent image of each of the characters of the character string B in the photoresist layer in $z_2$ radiation exposure steps by using the at least one photomask of the second type; wherein the combination of character strings A and B is used to uniquely identify each of the multiple plate members.

2. The method of claim 1, wherein the character string B includes at least two characters, and wherein the step (e)

includes the step of forming the latent image of one of the at least two characters of the character string B after another in the photoresist layer.

3. The method of claim 1, wherein the step (e) includes the step of forming the latent image of one of the characters of the character string B after another in the photoresist layer by using a plurality of photomasks of the second type, which includes the at least one photomask of the second type, one by one, the plurality of photomasks of the second type having opaque patterns that define mutually different types of characters.

4. The method of claim 1, wherein the step (c) includes the step of forming the photoresist layer of a positive photoresist material on the surface of the plate member, and wherein the method further comprises the step of developing the photoresist layer of the positive photoresist material and removing portions of the photoresist layer, which correspond to the character strings, from the surface of the plate member.

5. The method of claim 1, wherein the step (c) includes the step of forming the photoresist layer of a negative photoresist material on the surface of the plate member, and wherein the method further comprises the step of developing the photoresist layer of the negative photoresist material and leaving portions of the photoresist layer, which correspond to the character strings, on the surface of the plate member.

6. A method of recording mutually different identifiers on multiple plate members, each said identifier including a group of character strings having character strings A and B, the character string A including a number $z_1$ of characters, the character string B including a number $z_2$ of characters, where $z_1$ is an integer that is equal to or greater than two and $z_2$ is a natural number, the method comprising the steps of:

(a) preparing multiple photomasks of a first type, each said photomask of the first type has multiple openings that define multiple occurrences of the character string A and that are arranged periodically in X-axis and Y-axis directions in an opaque pattern where, if there are S possible symbols for each character in the character string A, then the number of photomasks of the first type needed to form each possible character string A is $S^{z_1}$;

(b) preparing multiple photomasks of a second type, each of the multiple photomasks of a second type have multiple openings that define multiple occurrences of one of the characters of the character string B and that are arranged periodically in the X-axis and Y-axis directions in an opaque pattern, where, if there are T possible symbols for each character in the character string B, then the number of photomasks of the second type needed to form each possible character string B is T;

(c) forming a photoresist layer on the surface of one of the plate members;

(d) forming latent images of the character strings A in the photoresist layer in a single radiation exposure step by using one of the multiple photomasks of the first type; and (e) forming latent images of one of the characters of the character string B after another in the photoresist layer in $z_2$ radiation exposure steps by sequentially selecting a required one of the photomasks of the second type after another; wherein the combination or character strings A and B is used to uniquely identify each of the multiple plate members.

7. The method of claim 6, wherein the step (e) includes the steps of:

(e1) aligning a first one of the photomasks of the second type with the photoresist layer so that a first selected character on the first photomask of the second type is projected onto a predetermined portion of the photoresist layer;

(e2) performing a first exposure process to form a latent image of the first selected character in the predetermined portion of the photoresist layer after the step (e1) of aligning the first photomask of the second type has been performed;

(e3) aligning the first one or a second one of the photomasks of the second type with the photoresist layer so that a second selected character on the first or second photomask of the second type is projected onto another predetermined portion of the photoresist layer; and (e4) performing a second exposure process to form a latent image of the second selected character in the another predetermined portion of the photoresist layer after the step (e3) of aligning the first or second photomask of the second type has been performed.

8. The method of claim 7, further comprising the step or forming alignment marks before the step (c) of forming the photoresist layer is performed, wherein at least one of the step (e1) and the step (e3) is carried out by using the alignment marks.

9. The method of claim 6, wherein the steps (d) and (e) include the step of forming the latent images of the character strings over the entire surface of the photoresist layer by using a mask aligner.

10. The method of claim 6, wherein the steps (d) and (e) include the step of forming the latent images of one of the character strings after another in multiple divided regions of the photoresist layer by using a stepper.

11. A method of recording mutually different identifiers on multiple plate members, each said identifier including a group of character strings having character strings A, B and C, the character string A including a number $z_1$ of characters, the character string B including a number $z_2$ of characters, the character string C including a number $z_3$ of characters, where $z_1$ is an integer that is equal to or greater than two and $z_2$ and $z_3$ are both natural numbers, the method comprising the steps of:

(a) preparing a photomask of a first type having an opaque pattern that defines at least the character string A, where, if there are S possible symbols for each character in the character string A, then the number of photomasks of the first type needed to form each possible character string A is $S^{z_1}$;

(b) preparing at least one photomask of a second type, each of the at least one photomask of the second type has an opaque pattern that defines one of the characters of the character string B, where, if there are T possible symbols for each character in the character string B, then the number of photomasks of the second type needed to form each possible character string B is T;

(c) forming a photoresist layer on the surface of one of the plate members;

(d) performing a first exposure process in such a manner that latent images of the character strings A and C are formed in each of multiple subdivided regions of the photoresist layer in one or two radiation exposure steps; and (e) performing a second exposure process in such a manner that latent images of one of the characters of the character string B are formed in predetermined portions of the multiple subdivided regions of the photoresist layer in $z_2$ radiation exposure steps by using the at least one photomask of the second type; wherein the character string A is used to identify each of the multiple plate members;

the character string B is used to uniquely identity each of the multiple subdivided regions; and the character string C is used to uniquely identify a location in each of the multiple subdivided regions.

12. The method of claim 11, wherein the step (d) includes the step of forming the latent images of mutually different character strings C in the multiple subdivided regions of the photoresist layer.

13. The method of claim 12, wherein the multiple subdivided regions of the photoresist layer are arranged in columns and rows, and wherein supposing the character string C that is allocated to one of the multiple subdivided regions is located at an intersection between an $M^{th}$ row and an $N^{th}$ column (where M and N are both natural numbers) and is identified by $C_{MN}$, $M \neq J$ and/or $N \neq K$ (where J and K are both natural numbers), $C_{MN} \neq C_{JK}$ is satisfied.

14. The method of claim 13, wherein supposing the character string A that is allocated to one of the multiple subdivided regions is located at the intersection between the $M^{th}$ row and the $N^{th}$ column (where M and N are both natural numbers) and is identified by $A_{MN}$, $M \neq J$ and/or $N \neq K$ (where J and K are both natural numbers), $A_{MN} \neq A_{JK}$ is satisfied.

15. The method of claim 11, wherein the step (d) of performing the first exposure process includes the step of exposing the photoresist layer to the radiation by using at least one photomask of a first type having an opaque pattern that defines the character strings A and C, and wherein the step (e) of performing the second exposure process includes the step of exposing the photoresist layer to the radiation by using at least one photomask of a second type having an opaque pattern that defines the characters of the character string B.

16. The method of claim 11, wherein the step (d) of performing the first exposure process includes the step of forming the latent images of the character strings A and C over the entire surface of the photoresist layer by using a mask aligner.

17. The method of claim 11, wherein the step (e) of performing the second exposure process includes the step of forming the latent images of the character strings B in one of multiple divided regions of the photoresist layer after another by using a stepper, each of the multiple divided regions of the photoresist layer being wider than each of the multiple subdivided regions of the photoresist layer and including the multiple subdivided regions of the photoresist layer.

18. The method of claim 17, wherein the step of forming the latent images of the character strings B includes the step of forming the latent images of one type of character strings B in one of the divided regions of the photoresist layer and then forming the latent images of another type of character strings B in another one of the divided regions of the photoresist layer.

19. A method of patterning a photoresist layer, the method comprising the steps of:

preparing the plate member including the photoresist layer that has been exposed to the radiation by the method as recited in claim 1; and developing the photoresist layer.

20. A method of recording an identifier on a plate member, the method comprising the steps of:

preparing the plate member including the photoresist layer that has been patterned by the method as recited in claim 19; and transferring the pattern of the identifier onto the surface of the plate member by using the patterned photoresist layer as a mask.

21. The method of claim 20, wherein the step of transferring the pattern of the identifier includes the step of selectively etching away surface portions of the plate member that are not covered with the patterned photoresist layer.

22. The method of claim 20, wherein the step of transferring the pattern of the identifier includes the step of forming convex portions on surface regions of the plate member that are not covered with the patterned photoresist layer.

23. The method of claim 20, wherein the step of transferring the pattern of the identifier includes the step of modifying surface regions of the plate member that are not covered with the patterned photoresist layer by exposing the surface regions to an energy beam.

24. A method of manufacturing electronic components, the method comprising the steps of:

preparing the plate member on which the identifiers have been recorded by the method as recited in claim 20;

depositing a thin film on a selected surface of the plate member; and dicing the plate member into multiple divided elements.

25. The method of claim 24, further comprising the step of recording the identifiers on the plate member so that each said divided element has one of the identifiers on the surface thereof.

26. The method of claim 25, wherein the step of recording the identifiers includes the step of recording the identifiers on the plate member so that each said divided element has a unique identifier on the surface thereof.

* * * * *